United States Patent [19]

Nogami et al.

[11] Patent Number: 5,157,359

[45] Date of Patent: Oct. 20, 1992

[54] CARRIER RESET FM MODULATOR AND METHOD OF FREQUENCY MODULATING VIDEO SIGNALS

[75] Inventors: Hiroaki Nogami, Matsudo; Soichi Iwamura, Fuchu, both of Japan

[73] Assignee: Sharp Kabushiki Kaisha, Osaka, Japan

[21] Appl. No.: 667,941

[22] Filed: Mar. 12, 1991

[30] Foreign Application Priority Data

Mar. 13, 1990 [JP] Japan .................................. 2-62211

[51] Int. Cl.$^5$ .............................................. H04N 9/80
[52] U.S. Cl. ........................................ 332/117; 332/127; 358/330; 358/23; 360/30
[58] Field of Search ................. 358/141, 142, 330, 23, 358/25; 332/123, 126, 127, 117; 360/30; 455/42, 110, 113

[56] References Cited

U.S. PATENT DOCUMENTS 4,839,615 6/1989 Sato ................................. 360/30 X

FOREIGN PATENT DOCUMENTS 63-274290 11/1988 Japan .
1-264492 10/1989 Japan .
1-305785 12/1989 Japan .

OTHER PUBLICATIONS

Patent Abstracts of Japan vol. 14, No. 105 (E-895) Feb. 26, 1990 & JP-A-1 305 785 (Sharp Corp) Dec. 11, 1989.
Patent Abstracts of Japan vol. 13, No. 103 (E-725) Mar. 10, 1989 & JP-A-63 274 290 (Sharp Corp) Nov. 11, 1988.
Patent Abstracts of Japan vol. 14, No. 28 (E-875) Jan. 19, 1990 & JP-A-1 264 492 (Sharp Corp) Oct. 20, 1989.
Patent Abstracts of Japan vol. 5, No. 91 (E-61) Jun. 13, 1981 & JP-A-56 036 277 (Victor Co. of Japan Ltd) Apr. 9 1981.
Patent Abstracts of Japan vol. 13, No. 2 (E-700) Jan. 6, 1989 & JP-A-63 212 285 (Sony Corp) Sep. 5, 1988.
Patent Abstracts of Japan vol. 11, No. 390 (E-567) Dec. 19, 1987 & JP-A-62 154 877 (Sony Corporation) Jul. 9, 1987.
Patent Abstracts of Japan vol. 6, No. 155 (E-125) Aug. 17, 1982 & JP-A-57 078 211 (NEC Home Electronics Ltd) May 15, 1982.

Primary Examiner—Siegfried H. Grimm
Attorney, Agent, or Firm—David G. Conlin; Robert M. Asher

[57] ABSTRACT

An FM modulator includes a base clock generating circuit (7) receiving an incoming video signal for generating an AFC reference frequency signal having a frequency and phase corresponding to a horizontal synchronizing signal of the incoming video signal, a first carrier reset pulse having the same frequency as the horizontal synchronizing signal and a second carrier reset pulse whose frequency is an integer mutliple of that of the horizontal synchronizing signal. The second reset pulse is generated at a timing speed lagged behind the first reset pulse. The FM modulator further includes an adder (3) for adding the first reset pulse to the incoming video signal for lowering the DC level at the leading edge portion of the horizontal synchronizing signal, and an oscillator (9, 9a, 9b, 10, 10a, 10b) whose oscillation frequency is changed dependent on the DC level of the output signal from the adder to produce a carrier FM modulated by the video signal. The oscillator is reset by the second reset pulse.

10 Claims, 3 Drawing Sheets

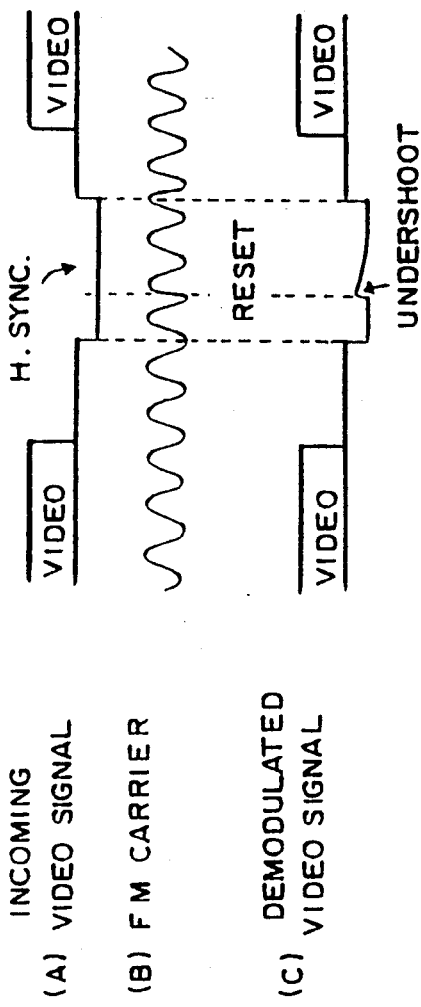
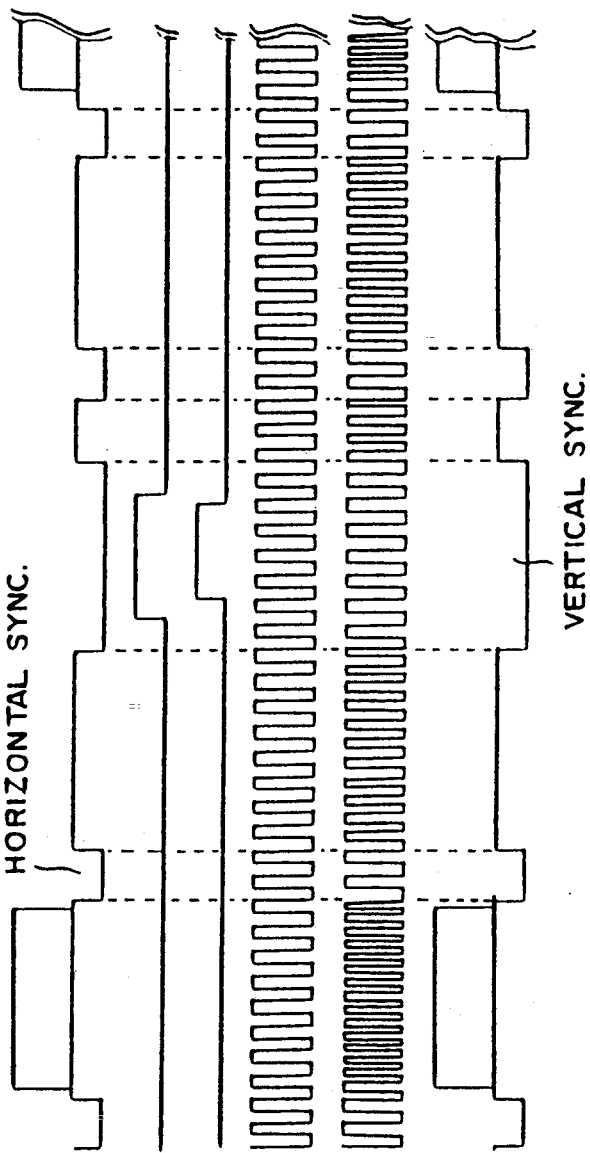
FIG. 1
PRIOR ART
(A) INCOMING VIDEO SIGNAL
(B) FM CARRIER
(C) DEMODULATED VIDEO SIGNAL
FIG. 4
(A) INCOMING VIDEO SIGNAL
(B) AFC SW PULSE
(C) AFC CLAMP S&H PULSE C
(D) AFC REFERENCE FREQUENCY SIGNAL
(E) FM CARRIER
(F) OUTPUT OF LPF 19

CARRIER RESET FM MODULATOR AND METHOD OF FREQUENCY MODULATING VIDEO SIGNALS

BACKGROUND OF THE INVENTION

1. Field of the Invention

The present invention relates to an FM modulator and, more specifically to an FM modulator for forming FM carrier capable of precise detection of jitter in reproduced video signals in a recording/reproducing apparatus. More specifically, the present invention relates to a carrier reset FM modulator for resetting phase of the FM carrier to be recorded at every horizontal period and to a method of FM modulating video signals.

2. Description of the Background Art

When video signals are recorded and reproduced by a video tape recorder (video cassette recorder) using a magnetic tape as a recording medium, time axis (base) fluctuation, that is, jitter of the reproduced video signals is generated, derived from fluctuation in tape running system. The jitter causes vibration in the reproduced image and no transmittance of reproduced video signals. Therefore, in reproducing circuitry, it is necessary to correct the time axis by detecting jitter so as to ensure stability of the reproduced image.

In a general video signal recording/reproducing apparatus, a specific portion of a rise or fall of a horizontal synchronizing signal included in the reproduced video signal is detected as a signal for detecting jitter, and correction of jitter is carried out based on the jitter detecting signal.

However, generally noise having random phases and levels is superimposed on the horizontal synchronizing signal. Such noise makes difficult the precise detection of rise/fall of the horizontal synchronizing signal, degrading precision of the jitter detecting signal. The degradation in precision of the jitter detecting signal makes sufficient correction of jitter difficult, and hence makes instable the reproduced image. Various jitter detecting apparatuses for precisely carrying out jitter correction have been proposed. Japanese Patent Laying-Open No. 63-274290, Japanese Utility Model Laying-Open No. 1-82572, Japanese Patent Laying-Open No. 1-264492 and Japanese Patent Laying-Open No. 1-305785 are examples disclosing such prior art.

Japanese Patent Laying-Open No. 63-274290 discloses a method of detecting jitter in which phase of FM carrier corresponding to horizontal synchronizing signal portion of incoming video signal is reset for every horizontal synchronizing signal before recording, when video signals are recorded, and in reproduction, the reset portion is used as a reference burst signal to provide a jitter detecting signal.

Japanese Utility Model Laying-Open No. 1-82572 discloses an FM modulating circuit in which two carrier reset (resetting of FM carrier) phases are provided in 1 cycle of the FM carrier and these two points are reset to either of the phases having phase difference of 180° whereby ringing pulse-like noise at a fall portion of the horizontal synchronizing signal generated in FM demodulator output during reproduction is reduced, and hence precision in jitter detection is improved.

Japanese Patent Laying-Open No. 1-264492 discloses a jitter detecting apparatus in which a pulse-like signal in white direction is added subsequent to a video signal at a front porch portion immediately before the fall of the horizontal synchronizing signal, and by adjusting pulse width and/or pulse height thereof, ringing at the fall portion of the horizontal synchronizing signal in FM demodulator output is prevented, and discontinuous and abrupt change of the FM carrier phase derived from carrier reset is suppressed.

Japanese Patent Laying-Open No. 1-305785 discloses a jitter correcting apparatus in which recording is done while carrier reset is carried out with horizontal synchronizing signal of positive polarity of a MUSE (Multiple Subnyquist Encoding) signal being replaced by a negative polarity horizontal synchronizing signal, the carrier reset portion is used as a reference burst signal in reproduction to carry out jitter correction, and then the synchronizing signal of negative polarity is converted into the synchronizing signal of positive polarity.

In the above described prior arts, jitter detecting signals of high precision are formed by making constant the phase of the FM carrier by carrier resetting, so as to stabilize reproduced image through sufficient correction of the jitter.

The reproduced image should be as stable as possible. Therefore, it is desirable to carry out jitter correction with the jitter detecting signal detected with higher precision. However, the following disadvantages arise, when the jitter detecting signals are to be obtained with higher precision.

A preemphasized video signal is applied to an FM modulator. This preemphasis changes the frequency corresponding to a tip of a synchronization signal. When carrier reset is made for resetting a phase of the FM carrier with random phase to 0° or 180°, there will be a discontinuation in the phase of the FM carrier, as shown in FIG. 1(B). In FIG. 1, the carrier reset point is shown at a position behind the leading edge of the horizontal synchronizing signal (H-SYNC). If a signal is FM demodulated with the phase of the FM carrier signal being discontinuous, an undershoot is generated in the reproduced FM carrier (FM demodulator output) corresponding to the discontinuation of the phase as shown in FIG. 1(C). If such an undershoot is generated at the leading edge portion of the horizontal synchronizing signal, it causes a distortion at the leading edge portion of the horizontal synchronizing signal (sawtooth shaped level change). This distortion makes the separation of synchronization signals unstable to cause a gating pulse for detecting a zero-cross point unstable, resulting in degraded precision of the jitter detecting signal, and makes the image instable. Such a distortion of the undershoot causes a distortion at a sync tip, which in turn generates a clamp error, resulting in poor synchronizing signal detection and fluctuation of luminance level of the reproduced video signal after FM demodulation.

An AFC (Automatic Frequency Control) circuit is provided in some FM modulators for FM modulating the incoming video signals. The AFC circuit has a function of comparing the incoming video signal with an AFC reference frequency signal, and of maintaining constant the frequency of FM modulated signal, which is the FM carrier, in accordance with the result of comparison.

The AFC reference frequency signal is generated from a reference frequency generator. The reference frequency generator comprises an oscillating circuit such as a crystal oscillator, whose oscillation characteristic tends to be changed due to temperature change or voltage change. Therefore, the frequency of the AFC reference frequency signal generated from such a reference frequency generator may vary easily as temperature or the voltage is changed. This variation causes fluctuation of the phase of the carrier reset FM carrier, makes unstable the phase of the reference burst signal obtained from the carrier reset FM carrier, causes deviation of the zero cross point, thereby degrades precision of the jitter detecting signal.

As described above, when a jitter detecting signal having higher precision is to be provided, the fluctuation of frequency of the AFC reference frequency signal derived from change in temperature or in voltage must be controlled. In addition, an undershoot generated in the horizontal synchronizing signal after FM demodulation caused by carrier reset must be reduced.

SUMMARY OF THE INVENTION

An object of the present invention is to provide an FM modulator which can provide highly precise and stable jitter detecting signals.

Another object of the present invention is to provide a carrier reset FM modulator which can generate FM carrier not generating an undershoot in a horizontal synchronizing signal after FM demodulation.

A further object of the present invention is to provide a method of FM modulation of video signals, in which stable reference burst signal can be generated as a jitter detecting signal.

A still further object of the present invention is to provide a method of FM modulation of a carrier by video signals of carrier reset type, in which an undershoot is not generated in a horizontal synchronizing portion of a reproduced video signal after FM demodulation.

The FM modulator in accordance with the present invention comprises a base clock generator generating an AFC reference frequency signal having its phase synchronized with a horizontal synchronizing signal and a carrier frequency corresponding to tip end of horizontal synchronizing signal of negative polarity, a first reset pulse having the same frequency as that of the horizontal synchronizing signal, and a second reset pulse having a frequency which is an integer multiple of the horizontal synchronizing signal frequency.

The FM modulator further comprises an adder circuit for adding the first reset pulse to a leading edge portion of the horizontal synchronizing signal of negative polarity of the incoming video signal. The adder circuit lowers DC level of the leading edge portion of the horizontal synchronizing signal by adding the first reset pulse, so as to form an oscillation stop portion.

The FM modulator further comprises an FM modulating circuit for FM modulating a carrier by output signals from the adder circuit to form FM carrier. The FM modulating circuit includes an oscillating circuit whose oscillation frequency changes dependent on the DC level of the output signal from the adder circuit.

The FM modulator further comprises a reset circuit for resetting the oscillating circuit in response to the second reset pulse. The second reset pulse is generated at a timing later than that of the first reset pulse. The FM carrier output from the FM modulating circuit includes in the horizontal period thereof an oscillation stop period in which instantaneous frequency at the leading edge portion is minimum in a prescribed period from the fall of the horizontal synchronizing signal, and a reset period subsequent to the oscillation stop period in which the phase is in synchronization with the second reset pulse.

The portion of the FM carrier in the reset period is used as the reference signal for detecting jitter during reproduction. By providing oscillation stop period of the FM carrier, transition causing excessive increase of the FM carrier instantaneous frequency derived from phase discontinuation at the carrier reset can be excluded. Consequently, generation of an undershoot in the horizontal synchronizing signal, causing errors in FM demodulation, can be prevented, and the reference signal for detecting jitter having stable zero cross point can be formed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram for illustrating disadvantages of the conventional carrier reset FM modulating system.

FIG. 4 is a diagram of signal waveforms showing specifically the operation of an error detecting circuit of the FM modulator shown in FIG. 2.

DESCRIPTION OF THE PREFERRED EMBODIMENTS

Figure 2:
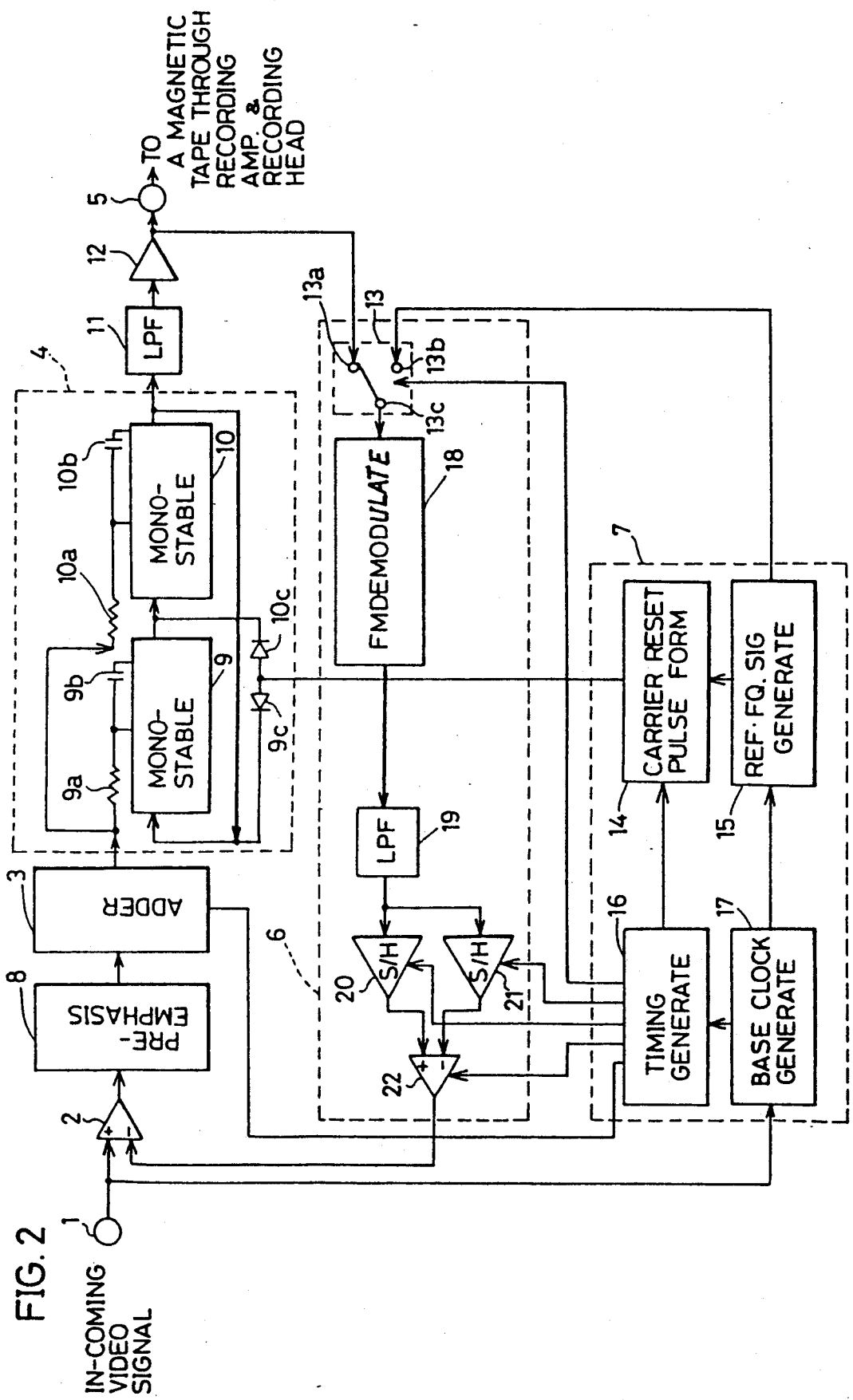
FIG. 2 is a block diagram schematically showing a structure of an FM modulator in accordance with one embodiment of the present invention.

Referring to FIG. 2, a carrier reset FM modulator in accordance with one embodiment of the present invention is provided between an input terminal 1 to which a video signal to be recorded is applied, and an output terminal 5 to which an FM carrier (FM modulated video signal) to be recorded is transmitted. The FM carrier at the output terminal 5 is recorded on, for example, a magnetic tape which is a recording medium, through a recording amplifier and a recording head (not shown).

The carrier reset FM modulator comprises an AFC clamp error DC correcting circuit (hereinafter simply referred to as a clamp circuit) 2 for correcting DC (direct current) level of the incoming video signal applied to the input terminal 1 to a constant level. The clamp circuit 2 clamps the DC level of the incoming video signal to a prescribed level, in response to an error detecting signal from an AFC frequency error detecting circuit, which will be described later.

The carrier reset FM modulator further comprises a base clock timing generating circuit 7 responsive to the incoming video signal for generating various timing signals, a DC amplifying carrier reset pulse adder circuit (hereinafter simply referred to as an adder circuit) 3 responsive to the video signal from the clamp circuit 2 and to a timing signal from the base clock generating circuit 7 for lowering DC level of the video signal by a prescribed value for a prescribed period of the horizontal synchronizing signal, an externally resettable FM modulating circuit (hereinafter simply referred to as an FM modulating circuit) 4 for FM modulation by output signal from the adder circuit 3 to generate FM carrier, and an AFC frequency error detecting circuit (hereinafter simply referred to as an error detecting circuit) 6 responsive to the FM carrier from the FM modulating circuit 4 and to a timing signal of the base clock generating circuit 7 for outputting a signal for correcting DC level of the incoming video signal.

The clamp circuit 2 corrects the level of the sync-tip of the horizontal synchronizing signal or the pedestal level to a constant DC level.

An output signal from the clamp circuit 2 is applied to the adder circuit 3 through a pre-emphasis circuit 8. The pre-emphasis circuit 8 emphasizes the amplitude of the high frequency range of the incoming video signal.

The adder circuit 3 adds a carrier reset pulse A (first carrier reset pulse) which is one of the timing signals from the base clock generating circuit 7 to the pre-emphasized incoming video signal, to form an oscillation stop portion in the incoming video signal, at which the DC level is lowered.

The FM modulating circuit 4 comprises a pair of single-shot multivibrators 9 and 10. An inverted output from the multivibrator 9 is applied to an input (trigger signal input) of the multivibrator 10, and an inverted output from the multivibrator 10 is provided to an input (trigger signal input) of the multivibrator 9. The FM carrier is output from the inverted output of the multivibrator 10.

The multivibrator 9 includes a capacitor 9b and a resistance 9a determining time constant thereof. An output signal from the adder circuit 3 is transmitted to one end of the resistance 9a. The multivibrator 10 includes a resistance 10a and a capacitor 10b determining the time constant thereof. An output signal from the adder circuit 3 is also applied to one end of the resistance 10a.

A carrier reset pulse is transmitted from the base clock signal generating circuit 7 to the input of multivibrators 9 and 10 through diodes 9c and 10c.

The multivibrators 9 and 10 are cascade connected, and the inverted output from the multivibrator 10 is fed back to the input of the multivibrator 9. Therefore, multivibrators 9 and 10 oscillate at a frequency whose time constant is determined by resistances 9a and 10a and capacitors 9b and 10b. The charge potential of capacitors 9b and 10b changes dependent on the output signal level of the adder circuit 3. The charge potential of capacitors 9b and 10b determines the state (stable state/meta-stable state) of multivibrators 9 and 10. Therefore, from multivibrator 10 (FM modulating circuit 4), an FM carrier is output with oscillating frequency of multivibrators 9 and 10 being changed corresponding to the incoming video signal.

When a carrier reset pulse B (second reset pulse) from base clock timing generating circuit 7 is generated, capacitors 9b and 10b of multivibrators 9 and 10 are discharged, so that the output state of multivibrators 9 and 10 is inverted. Thus reset of the FM carrier is done by the reset pulse B.

The FM carrier from FM modulating circuit 4 passes through a low pass filter (LPF) 11 in which unnecessary high frequency component is removed to improve S/N ratio, and is applied to an amplifier 12. An output signal from amplifier 12 is applied to FM carrier output terminal 5 and to the error detecting circuit 6.

The error correcting circuit 6 comprises a switch circuit 13 selectively passing the FM carrier from amplifier 12 or the AFC reference frequency signal from base clock generating circuit 7, an AFC FM demodulating circuit (hereinafter simply referred to as an FM demodulating circuit) for FM demodulating the FM signal from the switch circuit 18, and a low pass filter 19 for removing unnecessary high frequency component of the output signal from FM demodulating circuit 18.

The switch circuit 13 receives the FM carrier from amplifier 12 at one terminal 13a and receives the AFC reference frequency signal at the other terminal 13b. The switch circuit 13 selectively transmits either of the signals applied to terminals 13a and 13b to output terminal 13c, in response to the AFCSW pulse from the base clock generating circuit 7.

The FM demodulating circuit 18 is constituted of a frequency/voltage converting circuit for converting the output signal from switch circuit 13 to a voltage signal corresponding to the frequency thereof. Consequently, an FM demodulated signal is provided from the FM modulated signal.

The error detecting circuit 6 further comprises a first voltage sample and hold circuit 20 for sampling and holding output signal from low pass filter 19 in response to an AFC clamp S and H pulse A (first sample/hold pulse) which is one of the timing signals from base clock timing generating circuit 7, a second voltage sample and hold circuit 21 for sampling and holding the output signal from low pass filter 19 in response to AFC clamp S and H pulse C (third sample/hold pulse) which is one of the timing signals from base clock timing generating circuit 7, and a frequency error voltage sample and hold circuit 22 for comparing, in response to an AFC clamp S and H pulse B (second sample/hold pulse) which is one of the timing pulses from base clock generating circuit 7, the output signals from the voltage sample and hold circuits 20 and 21 and for holding and outputting a voltage signal corresponding to the difference between the two signals. An output from error voltage sample and hold circuit 22 is applied to a reference input of clamp circuit 2.

The base clock timing generating circuit 7 comprises a base clock generating circuit 17 for generating a base clock synchronized in phase with the incoming video signal applied to the input terminal 1, a timing generating circuit 16 responsive to the base clock from base clock generating circuit 17 for generating the AFC clamp S and H pulses A, B and C, a carrier reset pulse A and an AFCSW pulse, an AFC reference frequency generating circuit 15 responsive to the base clock from base clock generating circuit 17 for generating the AFC reference frequency signal, and a carrier reset pulse forming circuit 14 responsive to the AFC reference frequency signal and carrier reset gate pulse from timing generating circuit 16 for generating a carrier reset pulse B.

"The base clock has its phase synchronized with the incoming video signal" means. "The base clock has its phase synchronized with the horizontal and vertical synchronizing signals included in the incoming video signal".

The AFC reference frequency signal is set to have the same frequency as the FM carrier frequency corresponding to the tip (sync-tip) of the horizontal synchronizing signal of negative polarity. The frequency of the AFC reference frequency signal is different in different VTR recording systems. The AFC reference frequency signal has its phase synchronized with the horizontal synchronizing signal of the incoming video signal.

The frequency of an AFC reference frequency signal may be set to an integral multiple of the FM carrier frequency (instantaneous frequency) corresponding to the tip of the horizontal synchronizing signal of negative polarity.

Figure 3:
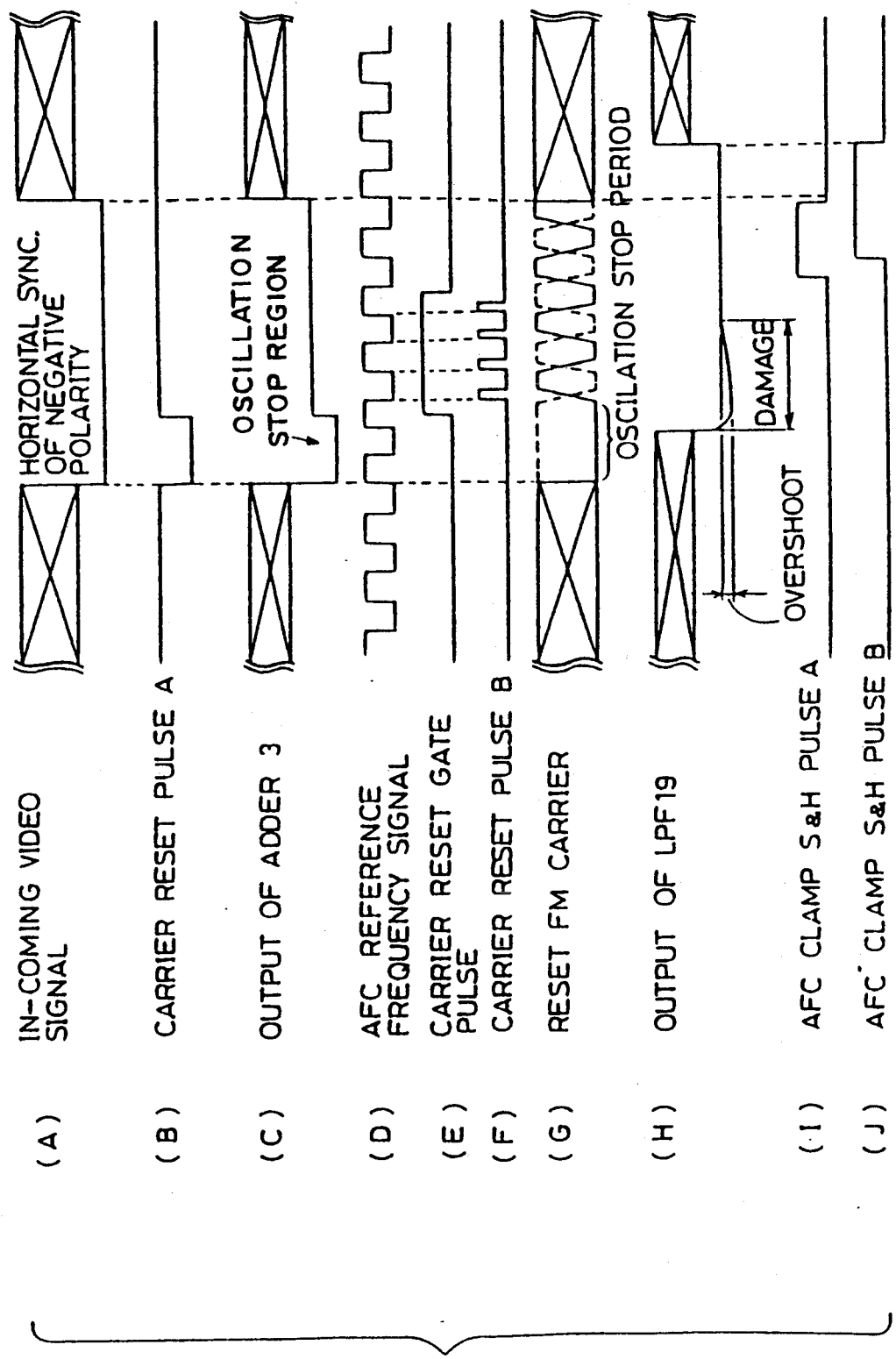
FIG. 3 is a diagram of signal waveforms showing the operation of the FM modulator shown in FIG. 2.

The operation of the FM modulating circuit shown in FIG. 2 will be described with reference to FIGS. 3 and 4 showing the signal waveforms of its operation.

A video signal (FIG. 3(A), FIG. 4(A)) to be recorded applied to input terminal 1 is applied to clamp circuit 2 and to base clock generating circuit 17. The base clock generating circuit 17 includes a synchronizing separator circuit and the like, and generates a base clock with phase synchronized with the input video signal.

The AFC reference frequency signal generating circuit 15 includes a PLL circuit and the like, and generates an AFC reference frequency signal (FIG. 3(D), FIG. 4(D)) having the same frequency as that of the FM carrier corresponding to the tip portion of the horizontal synchronizing signal of negative polarity and having its phase synchronized with the base clock (horizontal synchronizing signal).

The timing generating circuit 16 generates, in response to the base clock (horizontal synchronizing signal, vertical synchronizing signal), the carrier reset pulse A (FIG. 3(B)), carrier reset gate pulse (FIG. 3(E)), AFC clamp S and H pulse A (FIG. 3(F)), AFC clamp S and H pulse B (FIG. 3(J)), AFC clamp S and H pulse C (FIG. 3(C)) and AFCSW pulse (FIG. 4(B)).

The carrier reset pulse A is generated in negative polarity for a prescribed period from the fall of the horizontal synchronizing signal of the incoming video signal. The carrier reset gate pulse is generated for a prescribed period in the horizontal synchronizing period, in response to the end of generation of the carrier reset pulse A.

The AFC clamp S and H pulse A is generated in response to the end of generation of the carrier reset gate pulse. The AFC clamp S and H pulse B is generated until the trailing edge of the horizontal synchronizing signal in the output signal from the low pass filter 19 after the generation of and overlapping with the AFC clamp S and H pulse A. The AFCSW pulse has the same frequency as that of the vertical synchronizing signal, and is generated for a period including the vertical synchronizing period. The AFCSW pulse may be generated during the video signal period once in every field. The AFC clamp S and H pulse C is generated with its phase synchronized with (or in response to) the vertical synchronizing signal included in the base clock.

The carrier reset pulse forming circuit 14 forms the carrier reset pulse B (FIG. 3(F)) from the carrier reset gate pulse (FIG. 3(E)) and the AFC reference frequency signal. The carrier reset pulse B (FIG. 3(F)) is generated in response to the rise and fall of the AFC reference frequency signal, while the carrier reset gate pulse is generated. More specifically, the carrier reset pulse B (FIG. 3(F)) has a frequency twice that of the AFC reference frequency signal. In the shown example, the carrier reset pulse B is generated four times. However, the times of generation is arbitrary and what is necessary is that the frequency thereof is an integer multiple of the horizontal synchronizing signal.

The incoming video signal (FIG. 3A) is subjected to clamping of its DC level in the clamp circuit 2, and then it is applied to pre-emphasis circuit 8. The pre-emphasis circuit 8 applies the incoming video signal with the DC level clamped to the adder circuit 3, after emphasizing the high frequency range (expansion of amplitude) thereof.

The adder circuit 3 adds the carrier reset pulse A (FIG. 3(B)) to applied input video signal (FIG. 3(A)). The output signal from adder circuit 3 has its DC level lowered for a prescribed period near the leading edge of the horizontal synchronizing signal.

The FM modulating circuit 4 FM modulates the output signal from adder circuit 3. The FM modulating circuit 4 outputs a signal having the frequency proportional to the DC level of the applied signal. Therefore, the output signal from FM modulating circuit 4 is a signal having very small or zero frequency for a prescribed period after the addition of the carrier reset pulse A (FIG. 3(B)). Namely, during the period in which the carrier reset pulse A is applied, the charge potential of capacitors 9b and 10b of multivibrators 9 and 10 is extremely small, and the oscillating frequency thereof is very much lowered, or oscillation of the multivibrators 9 and 10 is stopped. Consequently, an FM carrier (FIG. 3(G), FIG. 4(E)) is provided with oscillation stopped (instantaneous frequency zero) for the prescribed period (oscillation stop portion).

The FM carrier (FIG. 3(G), FIG. 4(E)) starts oscillation (the change in phase starts) when it is synchronized in phase with the synchronizing signal or offset synchronized by 180° with the synchronizing signal of the incoming video signal (FIG. 3(A), FIG. 4(A)). By providing an oscillation stop period in the FM carrier, the influence of random noise at the leading edge of the horizontal synchronizing signal can be eliminated, and the phase of the FM carrier can substantially be set to a prescribed value at the leading edge portion of the horizontal synchronizing signal.

Multivibrators 9 and 10 of FM modulating circuit 4 are triggered by the carrier reset pulse B (FIG. 3(F)) from reset pulse forming circuit 14, so that both multivibrators 9 and 10 are set to meta-stable state. The carrier reset pulse B (FIG. 3(F)) is generated plural times during the generation period of the carrier reset gate pulse (FIG. 3(E)). When the carrier reset pulse B (FIG. 3 (F)) is applied to trigger inputs of multivibrators 9 and 10 through diodes 9c and 10c at an appropriate level with appropriate bias added, multivibrators 9 and 10 are set in an equivalent state as when a trigger pulse for inverting state is input, so that the output state of single-shot multivibrators 9 and 10 is inverted. When the carrier reset pulse B is input at a constant period, multivibrators 9 and 10 oscillate at a frequency having one half that period. At this time, the FM carrier has its phase inverted at prescribed positions, and oscillates at a prescribed frequency, and therefore the phase of the FM carrier (FIG. 3(G), FIG. 4(E)) is reset approximately to 0° or 180° in response to the carrier reset pulse B. In FIG. 3(G), the solid line in the horizontal synchronizing period represents phase of 0°, while the dotted line represents 180°.

In FIG. 3(C), the output level of the adder 3 is increased after the oscillation stop period is passed, to cause the monostable multivibrators 9 and 10 to start oscillating. At this operation, if no reset pulse B (FIG. 3(F)) is applied, the phase of the output of FM modulating circuit 4 is somewhat unstable according to unstability of the starting point of oscillation stop period or DC level therein. FM carrier with unstable phase (small phase deviation) is forcedly inverted by the reset pulse B, and then FM carrier with completely stabled phase (in synchronization in phase with the reset pulse B) is produced.

In addition, although the phase of FM carrier is somewhat unstable after the elapse of the oscillation stop period, FM modulating circuit 4 is once brought into oscillation stop condition, the phase inversion region of FM carrier lies near the generation point of the reset pulse B. Therefore, even if the phase of FM carrier is forcedly inverted by the reset pulse B to the phase of 0 degree or 180 degrees, the discontinuity in phase of FM carrier thereby is extremely small, reducing the distortion generated in FM demodulation.

More specifically, the capacitors 9b and 10b determining time constants of single-shot multivibrators 9 and 10 have their charge potentials changed dependent on the phase of immediately precedingly, received FM carrier (FIG. 3(G), FIG. 4(E)). As is well known, capacitors 9b and 10b are connected to a base (or gate) of one of cross coupled transistors. The on/off of the pair of transistors is determined by the charge potential of capacitors 9b and 10b. Therefore, dependent on the phase of the FM carrier provided immediately before, the output state of multivibrators 9 and 10 may be easily inverted or may not be easily inverted. The phase of the FM carrier immediately before the application of the carrier reset pulse B (FIG. 3(F)) is approximately 0° or 180°, because multivibrators 9 and 10 are not oscillating. At this time, if the carrier reset pulse B (FIG. 3(F)) with the level adjusted is applied plural times to the trigger inputs of multivibrators 9 and 10 through diodes 9C and 10C, inversion to a prescribed phase (0° to 180° or 180° to 0°) is possible without causing abrupt change in phase of the FM carrier (FIG. 3(G), FIG. 4(E)).

Therefore, if the DC level of the FM carrier during the oscillation stop period applied to resistances 9a and 9b is such a voltage level as to start oscillation at the frequency of the carrier reset pulse B (FIG. 3(F)), the FM carrier is reset to the phase of 0° or 180° when the carrier reset pulse B (FIG. 3(F)) including a plurality of pulses is applied.

Multivibrators 9 and 10 may have any structure, provided that it is set to the meta-stable state in response to a pulse signal applied to the trigger input.

Although diodes 9c and 10c are adapted to reset multivibrators 9 and 10 at the rise of the carrier reset pulse B, diodes 9c and 10c may be provided to trigger the multivibrators 9 and 10 at the fall of the carrier reset pulse B. As described above, by applying the carrier reset pulse B (FIG. 3(F)) with the level adjusted, plural times after a lapse of the oscillation stop period of the FM carrier, the FM carrier (FIG. 3(G), FIG. 4(E)) whose phase is completely in synchronization with the incoming video signal can be provided.

If oscillation of the FM modulating circuit 4 is stopped immediately before the application of the carrier reset pulse (FIG. 3(F)) to diodes 9c and 10c, carrier reset can be carried out at the phase of the carrier reset pulse B (FIG. 3(F)) without passing the transition period in which the frequency becomes higher than the instantaneous frequency of the FM carrier corresponding to the tip of the horizontal synchronizing signal of negative polarity. More specifically, when carrier reset is done during the normal oscillation operation of the modulating circuit 4 with its oscillation phase unfixed, a discontinuation of phase is generated, and there is a transition region in which a component exists having higher instantaneous frequency than the frequency of the FM carrier corresponding to the tip of the horizontal synchronizing signal of negative polarity. By preventing the generation of the transition region, generation of undershoot at the leading edge portion of the horizontal synchronizing signal after FM demodulation can be prevented.

Therefore, the output signal (FIG. 3(H), FIG. 4(F)) of low pass filter 19 receiving the output from AFC FM modulating circuit 18 overshoots (corresponding to the stop of oscillation) without undershoot, and then it has a constant voltage value corresponding to the frequency of the carrier reset pulse B (FIG. 3(F)).

By adjusting timing of generation of the carrier reset pulse A (FIG. 3(B)) and the carrier reset pulse B (FIG. 3(F)) and by adjusting the level of application thereof and thereby making the instantaneous frequency of the FM carrier in the oscillation stop period not to 0 but a finite small value, the amount of overshoot after FM demodulation can be reduced.

The FM carrier from the FM modulating circuit 4 is transmitted to output terminal 5 through low pass filter 11 and amplifier 12 and to one input terminal 13a of switch circuit 13. The AFC reference frequency signal (FIG. 3(D), FIG. 4(D)) is applied to the other input 13b of switch circuit 13.

The switch circuit 13 connects input terminal 13a and output terminal 13c when the AFCSW pulse (FIG. 4(B)) having the same frequency as that of the vertical synchronizing signal is applied. Therefore, in the vertical synchronizing period, the AFC reference frequency signal is applied to the AFC FM demodulating circuit 18.

The AFC reference frequency signal is converted to a voltage signal corresponding to the frequency thereof in AFC FM demodulating circuit 18. The level of the voltage signal attains to the level of the tip of the horizontal synchronizing signal of negative polarity. The AFC reference frequency signal from FM demodulating circuit 18 has its high frequency component removed by low pass filter 19, and then it is sampled and held in S and H circuit 21 in response to AFC clamp S and H pulse C (FIG. 4(C)). The AFC clamp S and H pulse C is generated in the generation period of the AFCSW pulse (FIG. 4(B)). Therefore, in the vertical synchronizing period, the AFC reference frequency signal is held by the second voltage S and H circuit 21. Namely, S and H circuit 21 applies the reference level of the tip of the horizontal synchronizing signal of negative polarity for the next field.

In the period in which the AFCSW pulse (FIG. 4(B)) is not generated, switch circuit 13 connects input terminal 13a with output terminal 13c. In this state, FM carrier from amplifier 12 is applied to FM demodulating circuit 18. The FM carrier is converted to a voltage signal by FM demodulating circuit 18 and is applied to the first S and H circuit 20 through low pass filter 19. S and H circuit 20 samples and holds the received signal in response to the AFC clamp S and H pulse A (FIG. 3(I)). The S and H pulse A is generated near the trailing edge of the horizontal synchronizing signal. In this period, the FM carrier is in a stable state, reset at the phase of 0° or 180°. Therefore, the first voltage S and H circuit 20 holds a voltage signal corresponding to the carrier reset, stable FM carrier (for example, having one half of the frequency of the reset pulse B).

The frequency error voltage S and H circuit 22 compares voltages held in the S and H circuits 20 and 21 in response to the AFC clamp S and H pulse B (FIG. 3(J)), and holds a voltage signal indicative of the difference between the two. The output signal from S and H circuit 22 is fed back to the clamp circuit 2 as an error voltage. The clamp circuit 2 corrects the DC level of the incoming video signal to be a constant value, in response to the error voltage signal.

It is an oscillator included in FM modulating circuit 4 that has a great temperature dependent characteristic. AFC circuitry (or loop) for stabilizing the oscillating frequency of the oscillator in FM modulating circuit 4 is resultantly implemented by automatic adjustment of DC level of video signals applied to the oscillator through negative feedback loop.

More specifically, the AFC path compares the FM carrier (FIG. 3G and FIG. 4E) in the horizontal synchronizing portion after the end of carrier reset of the leading edge portion of the horizontal synchronizing signal with the AFC reference frequency signal (FIG. 3D and FIG. 4D), both of which are converted into voltages, detects the error signal, and carries out AFC clamping so as to stabilize the instantaneous frequency of the FM carrier in the horizontal synchronizing period.

Thus, the instantaneous frequency of the FM carrier after the carrier reset in the horizontal synchronizing period becomes identical with the frequency of the AFC reference frequency signal (FIG. 3D and FIG. D), and is made stable against changes in temperature and voltage.

Since abrupt change in phase of the FM carrier can be prevented by the carrier reset pulse B (FIG. 3(F)), distortion in the horizontal synchronizing period after FM demodulation can be reduced. Therefore, detection of the horizontal synchronizing signal can be reliably carried out in reproduction thereof, and the gate pulse for detecting the zero cross point is made stable, leading to improved detecting precision of jitter detecting signals.

The jitter detecting signal is provided in the following manner. The reproduced video signal has the same waveform as the carrier reset FM carrier shown in FIG. 3(G). The output after FM demodulation has the same waveform as that shown in FIG. 3(C). The horizontal synchronizing signal portion of negative polarity is separated in response to the leading edge (fall) of the horizontal synchronizing signal of the video signal after FM demodulation. Then the carrier reset FM carrier is extracted from the reproduced video signal, in response to the carrier reset gate pulse (FIG. 3(E)) (generated from the clock whose phase is in synchronization with the reproduced video signal or from a horizontal synchronizing signal separated from a reproduced image signal). Phase adjustment, such as delay through a delay line, of FM carrier is carried out as necessary.

The extracted carrier reset FM carrier is applied to a narrow band filter. A pulse produced through delaying the trailing edge of a horizontal synchronizing signal is generated from the FM demodulation output. Another pulse signal is generated in response to the delayed pulse. The end of generation of the another pulse signal is realized by detecting the zero cross point of the output from the narrow band filter. The another pulse signal serves as the jitter detecting signal. A circuit similar to that shown in Japanese Patent Laying-Open No. 1-264492 may be used as the jitter detecting circuit, for example.

At this time, the jitter detecting signal can be provided by detecting the fall or rise (zero cross point) of the horizontal synchronizing signal included in the video signal after FM demodulation, extracting one or a plurality of carrier reset FM carrier signals from the reproduced video signal in response to the zero cross point, and by detecting the zero cross point of the extracted FM carriers.

If the length of the oscillation stop period, the end timing of the oscillation stop period, the timing of the carrier reset pulse B (FIG. 3F) after the end of the oscillation stop period, and the DC level of the carrier reset pulse A (FIG. 3B) added at the leading edge portion of the horizontal synchronizing signal are all adjusted, the period in which distortion tends to be generated after FM demodulation can be shortened, and the size (width) of the distortion and the level of the distortion can be reduced.

However, if the oscillation stop period is long and the DC level of the carrier reset pulse A (FIG. 3B) is a low voltage, the DC level of the distortion after FM demodulation is lowered, as an overshoot occurs. This is advantageous for synchronization separation after FM demodulation. However, if the oscillation stop period is excessively long, it takes long to realize phase synchronization. When the DC level of the carrier reset pulse A (FIG. 3B) is lowered to be not higher than a certain level, only the FM modulating circuit 4 stops oscillation, and other states are not changed. Therefore, there is a limit in adjusting the DC level of the carrier reset pulse A (FIG. 3B).

One example of the above described adjustment is shown in the following.

(a) FM carrier instantaneous frequency for the sync-tip of a horizontal synchronizing signal is 12 MHz.

(b) A pulse width of the carrier reset pulse A is about 120 nsec.

(c) The level of the carrier reset pulse A is about 50% of the maximum level of incoming video signals, which voltage level is added to the sync-tip portion so as to reduce DC level thereof.

(d) The number of pulses of the carrier reset pulse B is 4. However, the oscillating frequency thereof is set high if DC level of an input signal to the FM modulating circuit 4 is high, while the oscillating frequency of the pulse B is set low if DC level of the input signal to the FM modulating circuit 4 is low.

In operation under the above conditions, the precision in jitter detection become not higher than 5 nsec, and the region of the distortion with respect to the demodulated video signal is about 10% in terms of overshoots.

Although the carrier reset pulse B is input after the end of the oscillation stop period in the present embodiment, the carrier reset pulse B may be input during the oscillation stop period. In that case, an FM carrier having a portion which appears if it oscillates in the period of the carrier reset pulse B in the oscillation stopping period is provided. At this time, even in this case, the period in which the distortion occurs after FM demodulation can be reduced, and size and level of the distortion can be reduced by adjusting the length of the oscillation stop period, the end timing of the oscillation stop period, generation timing of the carrier reset pulse B after the end of the stop period, and the DC level of the carrier reset pulse A added at the leading edge portion of the horizontal synchronizing signal in FM carrier.

Although the externally resettable FM modulating circuit of the present invention is formed of single-shot multivibrators 9 and 10, resisters 9a and 10a, capacitors 9b and 10b and diodes 9c and 10c, it is not limited thereto. Similarly, although the AFC frequency error detecting circuit 6 comprises switch circuit 13, AFC FM demodulator 18, low pass filter 19, first and second S and H circuits 20 and 21, and frequency error voltage S and H circuit 22, it is not limited thereto.

As described above, when FM carrier is generated by using the carrier reset FM modulator of the present invention, the following effects are provided.

Since FM carrier is resultantly subjected to AFC through comparison of the AFC reference frequency signal and the FM carrier, the frequency of the FM carrier at the horizontal synchronizing portion is stabilized. Therefore, the phase of the FM carrier in synchronization with the horizontal synchronizing signal included in the incoming video signal becomes stable, and therefore the influence of temperature change and voltage change can be suppressed.

By providing the oscillation stop portion in the FM carrier, carrying out the carrier reset behind the oscillation stop portion, and by providing a plurality of second carrier reset pulses, FM carrier whose phase is in synchronization with the second carrier reset pulse can be output at least after the oscillation stop portion of the incoming video signal, whereby undershoot at the leading edge portion of the horizontal synchronizing signal in the reproduced video signal after FM demodulation can be suppressed.

Since the influence of the temperature change and voltage change is suppressed in carrier resetting and the undershoot after FM demodulation is reduced by the carrier reset pulses A and B, highly precise and stable reference burst signal can be provided, and jitter detecting signal can be provided with the zero cross point stabilized.

The present invention can be applied to video signals for high definition television (HDTV), composite video signals of NTSC system or PAL system, and to MUSE signal which is one of the systems for satellite broadcasting. In case of the MUSE signals, by converting the horizontal synchronizing signal of positive polarity to horizontal synchronizing signal of negative polarity before recording and by resetting the tip value of the horizontal synchronizing signal of negative polarity as the reference burst, FM carrier with several cycles carrier-reset can be formed as the reference burst signal to be recorded, even if the MUSE signal has very short horizontal blanking period.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An FM modulator for FM modulating a carrier by a video signal including a horizontal synchronizing signal of negative polarity for forming an FM carrier, comprising:

base clock timing generating means (7) responsive to an incoming video signal for generating an AFC reference frequency signal having a frequency corresponding to a tip of said horizontal synchronizing signal of negative polarity and its phase synchronized with the horizontal synchronizing signal of said incoming video signal, a first reset pulse having the same frequency as that of said horizontal synchronizing signal, and a second reset pulse having a frequency an integer multiple that of said horizontal synchronizing signal;

adding means (3) for adding said incoming video signal to said first reset pulse, said first reset pulse added to said incoming video signal so as to form an oscillation stop portion by lowering the DC level of the leading edge portion of said horizontal synchronizing signal of negative polarity of said incoming video signal;

an FM modulating means (4) for FM modulating a carrier by an output signal from said adding means to form an FM carrier, said FM modulating means including oscillating means (9, 9a, 9b, 10, 10a, 10b) whose oscillation frequency is changed in response to the level of the output signal from said adding means; and resetting means (9c, 10c) responsive to said second reset pulse for resetting an output from said oscillating means, said second reset pulse generated at a later timing than said first reset pulse, whereby said FM carrier includes an oscillation stop period in which change in phase is very small, and a reset period in which phase is synchronized with said second reset pulse, in the period of said horizontal synchronizing signal.

2. An FM modulating circuit according to claim 1, further comprising:

error detecting means (6) for detecting a difference between the frequency of the FM carrier in said reset period and the frequency of said AFC reference frequency signal; and clamping means (2) responsive to an output from said error detecting means for clamping the DC level of said incoming video signal at a prescribed level.

3. An FM modulator according to claim 1, wherein said FM modulating means comprises:

a first oscillator (9) including a first resistance (9a) and a first capacitor (9b) determining a time constant thereof and receiving said second reset pulse at a reset input; and a second oscillator (10) including a second resistance (10a) and a second capacitor (10b) determining a time constant thereof, receiving an output from said first oscillator and said second reset pulse at a reset input; wherein an output of said second oscillator provides said FM carrier and is applied to said reset input of said first oscillator, and an output from said adding means is applied to said first and second resistances so as to determine charge potential of said first and second capacitors through said first and second resistances.

4. An FM modulator according to claim 3, wherein each of said first and second oscillators is formed by a single-shot multivibrator having said reset input serving as a trigger signal input.

5. An FM modulator according to claim 1, wherein said base clock timing generating means comprises:

base clock generating means (17) for generating a base clock having its phase synchronized with said incoming video signal;

means (15) for generating said AFC reference frequency signal having its phase synchronized with said horizontal synchronizing signal, in response to said base clock;

timing generating means (16) responsive to said base clock, said timing generating means including means for generating an AFCSW pulse in synchronization with vertical synchronizing signal of said incoming video signal, means responsive to said horizontal synchronizing signal for generating a reset gate pulse determining duration period of said second reset pulse and for generating said first sample and hold pulse at a timing lagged behind that of said reset gate pulse, means responsive to said AFCSW pulse for generating a third sample and hold pulse, and means responsive to said first sample and hold pulse for generating second sample and hold pulse; and means (14) responsive to said reset gate pulse and to said AFC reference frequency signal for generating said second reset pulse.

6. An FM modulator according to claim 5, including an error detecting means comprising:

switching means (13) selectively passing either one of said FM carrier and said AFC reference frequency signal, in response to said AFCSW pulse;

FM demodulating means (18) for FM demodulating an output from said switching means;

first sample and hold means (20) responsive to said first sample and hold pulse for sampling and holding an output from said FM demodulating means;

second sample and hold means (21) responsive to said third sample and hold pulse for sampling and holding the output from said FM demodulating means; and third sample and hold means (22) responsive to said second sample and hold pulse for sampling outputs from said first and second sample and hold means and for outputting and holding a voltage signal corresponding to a difference between both sample values as said error detecting signal.

7. A method of generating an FM carrier through FM modulation of a carrier by an incoming video signal, said incoming video signal including a horizontal synchronizing signal of negative polarity, comprising the steps of:

generating an AFC reference frequency signal having a frequency corresponding to a tip of said horizontal synchronizing signal of negative polarity and being synchronized with the horizontal synchronizing signal of said incoming video signal, a first reset pulse having the same frequency as that of said horizontal synchronizing signal and a second reset pulse having a frequency an integer multiple that of said horizontal synchronizing signal, in response to said incoming video signal;

adding said first reset pulse to a leading edge portion of said horizontal synchronizing signal of negative polarity of said incoming video signal for lowering the DC level of said horizontal synchronizing signal;

changing oscillation frequency in response to the incoming video signal with said first reset pulse added thereto, for forming an FM carrier modulated by said incoming video signal, an instantaneous frequency of said FM carrier being a minimum at a region where said first reset pulse is added; and resetting said FM carrier in response to said second reset pulse, said second reset pulse generated at a timing lagged behind said first reset pulse, and said reset FM carrier having its phase synchronized with said second reset pulse.

8. A method according to claim 7, further comprising the steps of:

comparing the frequency of said FM carrier reset by said second reset pulse with the frequency of said AFC reference frequency signal, and clamping the DC level of said incoming video signal at a prescribed level, in accordance with a result of comparison of said step of comparison.

9. A method of forming an FM carrier through FM modulation of a carrier by an incoming video signal, said incoming video signal including a horizontal synchronizing signal of negative polarity, comprising the step of:

generating the FM carrier by changing an oscillation signal frequency in response to said incoming video signal; wherein said step of generating the FM carrier includes the steps of setting to minimum value an instantaneous frequency at a prescribed region of a leading edge portion of said horizontal synchronizing signal of negative polarity, and setting the remaining region of said horizontal synchronizing signal subsequent to said prescribed region at a frequency which is an integer multiple of the instantaneous frequency of the FM carrier corresponding to a tip of said horizontal synchronizing signal of negative polarity, said remaining region being reset to one of two phases having a phase difference of 180°.

10. An apparatus for FM modulating a carrier by an incoming video signal for recording on recording media, said incoming video signal including a horizontal synchronizing signal of negative polarity, comprising:

first means (3, 7) receiving the incoming video signal for lowering the DC level of a prescribed period at a leading edge portion of said horizontal synchronizing signal of negative polarity of the received incoming video signal;

oscillating means (9, 9a, 9b, 10, 10a, 10b) coupled to said first means, an oscillation frequency thereof being changed dependent on the DC level of an output from said first means;

resetting means (9c, 10c, 7) for resetting said oscillating means so that the remaining region of said horizontal synchronizing signal subsequent to the region where said DC level is lowered becomes a signal having a frequency corresponding to a tip of the horizontal synchronizing signal of the negative polarity and its phase synchronized with said horizontal synchronizing signal of said incoming video signal; and means for recording an output from said oscillating means on a recording medium; wherein the region reset by said resetting means is used as a reference signal for detecting time axis fluctuation of a reproduced video signal during reproduction.

* * * * *